(12) United States Patent
Choi et al.

(10) Patent No.: US 12,444,977 B2
(45) Date of Patent: Oct. 14, 2025

(54) WIRELESS POWER APPARATUS FOR SUBSTRATES TREATING APPARATUS AND MANUFACTURING METHOD OF WIRELESS POWER APPARATUS FOR SUBSTRATE TREATING APPARATUS

(71) Applicant: SEMES CO., LTD., Cheonan-si (KR)

(72) Inventors: Chan Young Choi, Suwon-si (KR); Ki Won Han, Anseong-si (KR); Wan Hee Jeong, Hwaseong-si (KR); Kyo Bong Kim, Seongnam-si (KR); Hee Chan Kim, Hwaseong-si (KR); Doo Hyun Baek, Hwaseong-si (KR); Sang-Oh Kim, Seoul (KR); Hee Jae Byun, Yongin-si (KR)

(73) Assignee: SEMES CO., LTD., Chungcheongnam-do (KR)

( * ) Notice: Subject to any disclaimer, the term of this patent is extended or adjusted under 35 U.S.C. 154(b) by 0 days.

(21) Appl. No.: 18/307,092

(22) Filed: Apr. 26, 2023

(65) Prior Publication Data

US 2024/0146103 A1    May 2, 2024

(30) Foreign Application Priority Data

Oct. 27, 2022    (KR) .......................... 10-2022-0140437

(51) Int. Cl.
*H02J 50/00* (2016.01)
*H01L 21/67* (2006.01)
(Continued)

(52) U.S. Cl.
CPC ...... *H02J 50/005* (2020.01); *H01L 21/67011* (2013.01); *H01L 21/68707* (2013.01); *H02J 50/10* (2016.02)

(58) Field of Classification Search
CPC .......... H02J 50/005; H02J 50/10; H02J 50/12; H01L 21/67011; H01L 21/68707;
(Continued)

(56) References Cited

U.S. PATENT DOCUMENTS 3,996,510 A * 12/1976 Guichard ............... G01V 3/102
                                                  336/84 R
6,642,896 B2 * 11/2003 Kim ................... G06K 7/10336
                                                  343/742
(Continued)

FOREIGN PATENT DOCUMENTS

JP    2010013009 A  *  1/2010
JP    6378330 B2       8/2018
(Continued)

OTHER PUBLICATIONS

"Case of Application of Electric Car Wireless Power Transmission", KIPE, pp. 50-53, published 2016.

*Primary Examiner* — Hal Kaplan
*Assistant Examiner* — Brian K Baxter
(74) *Attorney, Agent, or Firm* — Harness, Dickey & Pierce, P.L.C.

(57) ABSTRACT

Embodiments of the inventive concept provide a wireless power apparatus for a substrate treating apparatus and a manufacturing method for the wireless power apparatus for the substrate treating apparatus for preventing a heat generation by preventing a generation of an eddy current in a coupling element, if the coupling element is used around an outer housing at which an induced magnetic field is formed. The inventive concept provides a wireless power apparatus for a substrate treating apparatus. The wireless power apparatus includes an outer housing having a main power line forming an induced magnetic field by receiving a power, and a coupling part coupling at least two components among components which are positioned at a periphery of the main (Continued)

power line for fixing the main power line; and an inner housing positioned spaced apart from the outer housing, generating an electromotive force through the induced magnetic field generated from the outer housing, and supplying the electromotive force which is generated to the substrate treating apparatus, and wherein the coupling part is formed of a material at which an eddy current is not generated by the induced magnetic field.

18 Claims, 7 Drawing Sheets

(51) Int. Cl.
*H01L 21/687* (2006.01)
*H02J 50/10* (2016.01)

(58) Field of Classification Search
CPC ........ H01F 27/306; H01F 27/24; H01F 38/14; H01F 41/00; H01F 1/344
See application file for complete search history.

(56) References Cited

U.S. PATENT DOCUMENTS

| | | | | |
|---|---|---|---|---|
| 9,306,626 | B2* | 4/2016 | Hall | H04B 5/00 |
| 10,170,936 | B2* | 1/2019 | Cho | H01F 27/36 |
| 10,491,043 | B2* | 11/2019 | Bae | H01F 27/324 |
| 11,075,543 | B2* | 7/2021 | Jung | H02J 50/12 |
| 11,087,912 | B2* | 8/2021 | Jang | H02J 50/70 |
| 11,387,679 | B2* | 7/2022 | Teply | H02J 50/005 |
| 2010/0244583 | A1* | 9/2010 | Shimokawa | H04B 5/79 |
| | | | | 307/104 |
| 2012/0098486 | A1* | 4/2012 | Jung | H02J 50/90 |
| | | | | 320/108 |
| 2013/0021033 | A1* | 1/2013 | Stoeckel | A61B 5/055 |
| | | | | 324/318 |
| 2014/0103737 | A1* | 4/2014 | Bae | H02J 50/80 |
| | | | | 307/104 |
| 2014/0124994 | A1* | 5/2014 | May | G01B 7/14 |
| | | | | 324/207.13 |
| 2014/0210407 | A1* | 7/2014 | Won | H01F 38/14 |
| | | | | 320/108 |
| 2014/0292099 | A1* | 10/2014 | Jung | H02J 50/80 |
| | | | | 307/104 |
| 2015/0288196 | A1* | 10/2015 | Park | H02J 50/005 |
| | | | | 307/104 |
| 2016/0118179 | A1* | 4/2016 | Park | H01F 38/14 |
| | | | | 320/108 |
| 2016/0118838 | A1* | 4/2016 | Ou | H02J 50/10 |
| | | | | 320/108 |
| 2016/0172871 | A1* | 6/2016 | Jung | H04B 5/24 |
| | | | | 307/104 |
| 2016/0352147 | A1* | 12/2016 | Von Novak, III | B60L 53/122 |
| 2017/0076859 | A1* | 3/2017 | An | H01F 38/14 |
| 2017/0077754 | A1* | 3/2017 | Jeong | H02J 50/12 |
| 2017/0222467 | A1* | 8/2017 | Jeong | H01F 27/366 |
| 2017/0222491 | A1* | 8/2017 | Von Novak, III | H02J 50/90 |
| 2017/0326992 | A1* | 11/2017 | Budhia | H02J 50/10 |
| 2017/0365393 | A1* | 12/2017 | Kim | H01F 1/12 |
| 2018/0191198 | A1* | 7/2018 | Song | H02J 50/10 |
| 2020/0021135 | A1* | 1/2020 | Lee | H02J 50/90 |
| 2020/0412175 | A1* | 12/2020 | Han | H02J 7/02 |
| 2021/0018889 | A1* | 1/2021 | He | H02J 50/10 |
| 2023/0026256 | A1* | 1/2023 | Komatsu | H02J 50/10 |
| 2023/0060295 | A1* | 3/2023 | Romero | G01R 33/098 |
| 2024/0014059 | A1* | 1/2024 | Choi | H02J 50/10 |
| 2024/0105484 | A1* | 3/2024 | Mitsuyoshi | H01L 21/67057 |
| 2024/0146109 | A1* | 5/2024 | Ho | H02J 7/0044 |

FOREIGN PATENT DOCUMENTS

| | | |
|---|---|---|
| KR | 100432164 B1 | 5/2004 |
| KR | 20-2016-0002773 A | 1/2016 |
| KR | 200481519 Y1 | 10/2016 |
| KR | 10-2018-0004313 A | 1/2018 |
| KR | 101854564 B1 | 5/2018 |
| KR | 10-2020-0063218 A | 6/2020 |
| KR | 10-2020-0105663 A | 9/2020 |

* cited by examiner

WIRELESS POWER APPARATUS FOR SUBSTRATES TREATING APPARATUS AND MANUFACTURING METHOD OF WIRELESS POWER APPARATUS FOR SUBSTRATE TREATING APPARATUS

CROSS-REFERENCE TO RELATED APPLICATIONS

A claim for priority under 35 U.S.C. § 119 is made to Korean Patent Application No. 10-2022-0140437 filed on Oct. 27, 2022, in the Korean Intellectual Property Office, the entire contents of which are hereby incorporated by reference.

TECHNICAL FIELD

Embodiments of the inventive concept described herein relate to a wireless power apparatus for a substrate treating apparatus and a manufacturing method for the wireless power apparatus for the substrate treating apparatus. More specifically, embodiments of the inventive concept related to a wireless power apparatus for a substrate treating apparatus and a manufacturing method for the wireless power apparatus for the substrate treating apparatus for supplying a power wirelessly to a substrate manufacturing facility.

BACKGROUND

A wireless power apparatus wirelessly supplies a power using a magnetic resonance method, and is widely used to wirelessly supply the power to an article facility or a semiconductor manufacturing facility of a semiconductor manufacturing line.

A conventional wireless power apparatus is installed in the form of a rail which supplies the power, and consists of an outer housing which generates a magnetic field around it by flowing a high-frequency current, and an inner housing which generates a current which magnetically induced by a magnetic field of the outer housing which is mounted on the semiconductor manufacturing facility or the article facility. at which an induced magnetic field is formed In this case, the outer housing consists of coil fixing part for fixing an inner coil to a specific position and a fastening element for fastening the coil fixing part and the coil fixing part. In this case, the fastening element usually uses an iron or an aluminum material screw. The iron or the aluminum material screws have a relatively higher non-permeability than other metals, and an eddy current increases a screw temperature.

Therefore, if a metal screw is used around the outer housing, the screw is heated to increase a drifting load loss of the wireless power apparatus, causing a problem of lowering a power transmission efficiency of the wireless power apparatus.

In addition, the conventional wireless power apparatus is seen to be steadily increasing a driving frequency to improve a wireless power efficiency. As the driving frequency increases, the screw temperature of the metal material increases, which causes a problem of further lowering the power transmission efficiency of the wireless power apparatus.

SUMMARY

Embodiments of the inventive concept provide a wireless power apparatus for a substrate treating apparatus and a manufacturing method for the wireless power apparatus for the substrate treating apparatus for preventing a heat generation by preventing a generation of an eddy current in a coupling element, if the coupling element is used around an outer housing at which an induced magnetic field is formed.

The technical objectives of the inventive concept are not limited to the above-mentioned ones, and the other unmentioned technical objects will become apparent to those skilled in the art from the following description.

The inventive concept provides a wireless power apparatus for a substrate treating apparatus. The wireless power apparatus includes an outer housing having a main power line forming an induced magnetic field by receiving a power, and a coupling part coupling at least two components among components which are positioned at a periphery of the main power line for fixing the main power line; and an inner housing positioned spaced apart from the outer housing, generating an electromotive force through the induced magnetic field generated from the outer housing, and supplying the electromotive force which is generated to the substrate treating apparatus, and wherein the coupling part is formed of a material at which an eddy current is not generated by the induced magnetic field.

In an embodiment, the outer housing further comprises a base installed at a periphery of the substrate treating apparatus as the component, and a track part closely contacting the base and providing a region at which the main power line in mounted.

In an embodiment, the outer housing further comprises a guide part which closely contacts the track part and which surrounds the main power line and which is coupled to the main power line, and the coupling part is configured in a plurality, and the plurality of coupling parts each couple the base and the track part, and couple the track part and the guide part.

In an embodiment, the outer housing further comprises a drift preventing body positioned between the base and the track part.

In an embodiment, the drift prevention body is formed in a ferrite material.

In an embodiment, the coupling part communicates and is screw-coupled to the track part and the base.

In an embodiment, the outer housing further comprises an auxiliary coupling part which couples to the coupling part and pressurizes the base and the track part.

In an embodiment, the coupling part fastens to the auxiliary coupling part in a state in which the base and the track part are not screw-coupled.

In an embodiment, the auxiliary coupling part has a body portion at which a coupling hole is formed and a protrusion which is formed extending in an outer circumference direction of the body portion, and the body portion of the auxiliary coupling part is inserted to communicate with the base, and the base and the track part are positioned between the coupling part and the protrusion of the auxiliary coupling part, and the coupling part and the auxiliary coupling part are fastened in state pressurizing the base and the track part.

In an embodiment, the coupling part couples the base and the track part with a bonding.

In an embodiment, the coupling part is formed of a resin material and which couples the base and the track part with a bonding while being filled between the base and the track part.

In an embodiment, the coupling part couples the track part and the guide part with a bonding.

In an embodiment, the coupling part is composed of a resin material and couples the base and the guide part with a bonding while being filled between the base and the guide part.

In an embodiment, the coupling part is formed of a resin material or a ceramic material.

In an embodiment, the inner housing includes a coil and a core part at which the coils are wind around.

In an embodiment, the core part includes a coil winding region at which the coil is wind around, and an outer region which is formed protruding in a same direction as the coil winding region while extending from the coil winding region and which is positioned surrounding an outer space of the coil.

In an embodiment, the core part is formed of a ferrite material.

In an embodiment, the substrate treating apparatus is formed of a semiconductor manufacturing facility or a semiconductor transfer robot.

The inventive concept provides a manufacturing method of a wireless power apparatus for a substrate treating apparatus. The manufacturing method includes coupling a guide part to a track part by using a coupling part by directly fastening or bond-coupling; coupling the track part by fastening the base and the track part to the coupling part or by coupling the base and the track part with a bonding; coupling a main power line by inserting the main power line to fit into the guide part; and positioning an inner housing so a coil and a winding region of a core part is positioned between the main power line.

The inventive concept provides a wireless power apparatus for a substrate treating apparatus. The wireless power apparatus includes an outer housing having a main power line forming an induced magnetic field by receiving a power, a base installed at a periphery of the substrate treating apparatus, a track part closely contacting the base, a guide part which closely contacts the track part and which surrounds the main power line and which is coupled to the main power line, a drift preventing body positioned at a periphery of the main power line between the base and the track part and formed of a ferrite material, a coupling part coupling at least two components among the base, the track part, the guide part, and the drift preventing body and which is formed of a resin material or a ceramic material, and an auxiliary coupling part which couples with the coupling part and pressurizes the base and the track part; and an inner housing having a coil generating an electromotive force through an induced magnetic field generated from the outer housing and supplying the electromotive force which is generated to the substrate treating apparatus, a coil winding region formed of a ferrite material and at which the coil is wind around, and an outer region which is formed protruding in a same direction as the coil winding region while extending from the coil winding region and which is positioned surrounding an outer space of the coil; and wherein the coupling part is configured in a plurality, and the plurality of coupling parts each couple the base and the track part, and couple the track part and the guide part, the drift prevention body is formed in a ferrite material, the coupling part communicates and is screw-coupled to the track part and the base, the coupling part fastens to the auxiliary coupling part in a state in which the base and the track part are not screw-coupled, the auxiliary coupling part has a body portion at which a coupling hole is formed and a protrusion which is formed extending in an outer circumference direction of the body portion, the body portion of the auxiliary coupling part is inserted to communicate with the base, the base and the track part are positioned between the coupling part and the protrusion of the auxiliary coupling part, the coupling part and the auxiliary coupling part are fastened in state pressurizing the base and the track part, the coupling part couples the base and the track part with a bonding, the coupling part couples the base and the track part with a bonding while being filled between the base and the track part, the coupling part couples the track part and the guide part with a bonding, the coupling part is formed of polyether ether ketone (PEEK) material, if formed of a resin material, the substrate treating apparatus is formed of a semiconductor manufacturing facility or a semiconductor transfer robot.

According to an embodiment of the inventive concept, a heat generation is prevented by preventing a generation of an eddy current in a coupling element, if the coupling element is used around an outer housing at which an induced magnetic field is formed.

The effects of the inventive concept are not limited to the above-mentioned ones, and the other unmentioned effects will become apparent to those skilled in the art from the following description.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
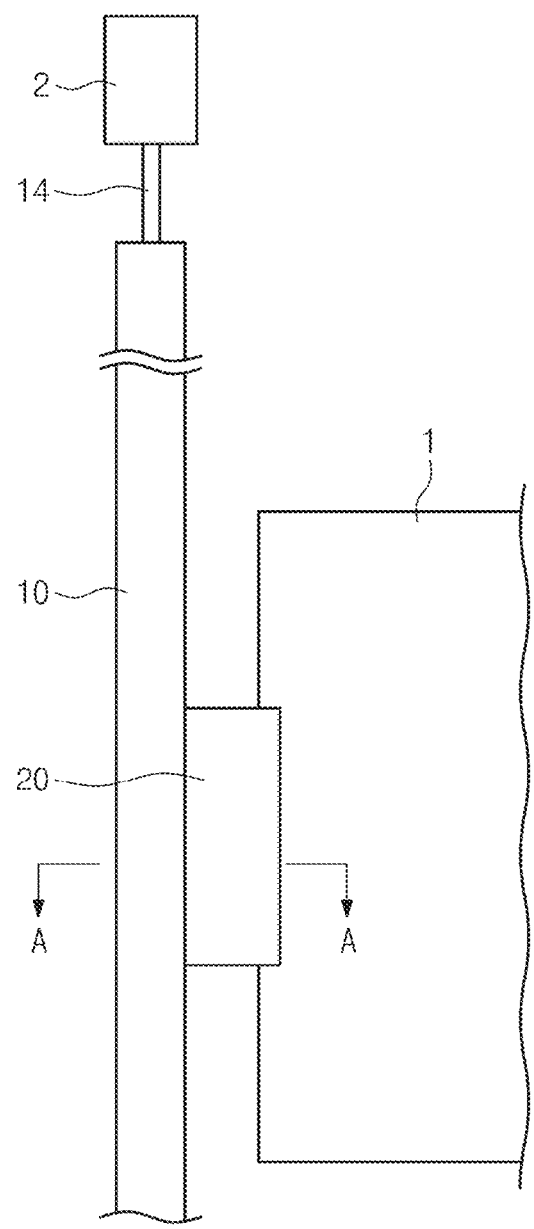
FIG. 1 is a plan view of a wireless power apparatus for a substrate treating apparatus according to an embodiment of the inventive concept.

Example embodiments will now be described more fully with reference to the accompanying drawings. Example embodiments are provided so that this disclosure will be thorough and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

When the term "same" or "identical" is used in the description of example embodiments, it should be understood that some imprecisions may exist. Thus, when one element or value is referred to as being the same as another element or value, it should be understood that the element or value is the same as the other element or value within a manufacturing or operational tolerance range (e.g., ±10%).

When the terms "about" or "substantially" are used in connection with a numerical value, it should be understood that the associated numerical value includes a manufacturing or operational tolerance (e.g., ±10%) around the stated numerical value. Moreover, when the words "generally" and "substantially" are used in connection with a geometric shape, it should be understood that the precision of the geometric shape is not required but that latitude for the shape is within the scope of the disclosure.

Unless otherwise defined, all terms (including technical and scientific terms) used herein have the same meaning as commonly understood by one of ordinary skill in the art to which example embodiments belong. It will be further understood that terms, including those defined in commonly used dictionaries, should be interpreted as having a meaning that is consistent with their meaning in the context of the relevant art and will not be interpreted in an idealized or overly formal sense unless expressly so defined herein.

Figure 2:
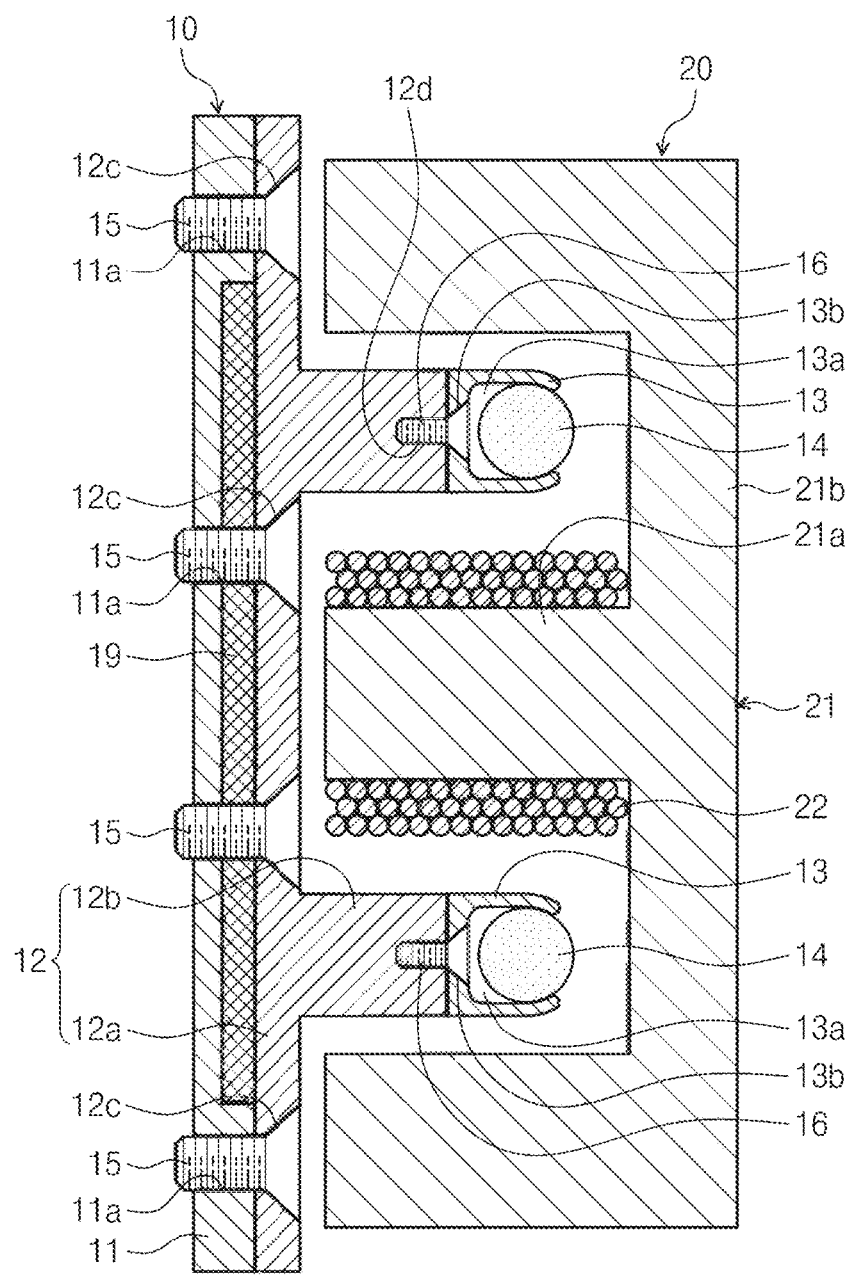
FIG. 2 is a cross-sectional view taken along line A-A of the wireless power apparatus shown in FIG. 1.

FIG. 1 is a plan view of a wireless power apparatus for a substrate treating apparatus according to an embodiment of the inventive concept. FIG. 2 is a cross-sectional view taken along line A-A of the wireless power apparatus shown in FIG. 1.

As shown in FIG. 1 and FIG. 2, the wireless power apparatus for the substrate treating apparatus in accordance with an embodiment of the inventive concept includes an outer housing 10 and an inner housing 20.

The outer housing 10 places a main power line 14 through which a current flows therein, and generates an induced magnetic field to the inner housing 20 through the power line to generate an electromotive force to a server coil at the inner housing 20 to supply a power wirelessly to a load connected to the inner housing 20. Like this, the outer housing 10 is installed in a track shape such as a rail, and is installed around a semiconductor manufacturing facility (not shown) such as a semiconductor cleaning apparatus, a semiconductor exposure apparatus, and a semiconductor etching apparatus, or around a semiconductor article transfer robot (not shown) which automatically transfers a semiconductor article item such as a wafer and other semiconductor substrates to form an induced magnetic field around a track by supplying a high frequency power. In an embodiment, the semiconductor manufacturing facility or the semiconductor article transfer robot described above will be collectively referred to as the substrate treating apparatus 1. As described above, the outer housing 10 may be operated on various types of tracks installed around the substrate treating apparatus 1 such as a semiconductor manufacturing facility or a semiconductor article transfer robot. In the embodiment, a detailed description of a structure surrounding the outer housing 10 will be omitted so as not to obscure the gist of the inventive concept, and detailed configurations of the outer housing 10 and the inner housing 20 will be mainly described.

In the inventive concept, the outer housing 10 includes a base 11, a track part 12, a guide part 13, a main power line 14, a first coupling part 15 and a second coupling part 16, and further includes a drift preventing body 19 as components.

The base 11 is formed in a plate shape and is installed around the substrate treating apparatus 1. In addition, the base 11 may be formed of a metal material such as an aluminum. However, in the inventive concept, a material of the base 11 is not limited to the above-described example, and the material of the base 11 may be modified to various materials such as a resin material. In addition, the base 11 is formed with a first fastening hole 11a through which the first coupling part 15 may be fastened by screw-coupled. In this case, the base 11 may be fixed to a ceiling, a wall surface, or a floor surface by a support member which is not shown in the view. The base 11 provides a region in which the track part 12, to which the main power line 14 is coupled, may be fixed to.

The track part 12 includes a coupling region 12a formed in a plate shape and closely attached to the base 11 and a protrusion region 12b protruding from the coupling region 12a toward the inner housing 20 to support the guide part 13. In addition, a second fastening hole 12c is formed in the coupling region 12a at a position corresponding to the first fastening hole 11a. A body portion of the first coupling part 15 is inserted into the second fastening hole 12c. In addition, a counter sink is formed in the second fastening hole 12c toward the inner housing 20, and a head portion of the first coupling part 15 is closely attached to the counter sink. In this case, the counter sink may be modified into a counterbore according to the shape of the head of the first coupling part 15. In addition, the protruding region 12b is composed of two regions, and the two regions are disposed to be spaced apart from each other. In addition, a third fastening hole 12d to which the second coupling part 16 is screw-coupled may be further formed in the protruding region 12b. In addition, the track part 12 is made of a resin material such as a polycarbonate (PC) so that it is not magnetized by an induced magnetic field generated from the main power line 14. However, in the inventive concept, a material of the track part 12 is not limited to polycarbonate, and may be modified to various resin materials. The track part 12 serves to fix the main power line 14 so that it does not flow by providing a coupling space to which the main power line 14 can be coupled. In addition, the track part 12 may be modified and implemented in various forms, such as an E-type, an I-type, or an S-type, depending on a shape of the core part 21.

The guide part 13 is coupled to the protruding region 12b of the track part 12. In this case, the guide part 13 is formed in a shape having a side of the body opened, and a coil accommodation region 13a in which a main coil is accommodated is formed in an opened region. In this case, the coil accommodation region 13a is formed to surround and fit an outer circumference of the main power line 14 so that the main power line 14 is not separated from the coil accommodation region 13a. In addition, the guide part 13 has a fourth fastening hole 13b formed at a position communicating with the second fastening hole 12c in the protruding region 12b, and the body portion of the second fastening part 16 is inserted into the fourth fastening hole 13b. In addition, a counter sink is formed in the fourth fastening hole 13b, and the head portion of the second coupling part 16 is seated in the counter sink of the fourth fastening hole 13b. The guide part 13 serves to fix the main power line 14 at a specific position of the track part 12 so as not to flow. In addition, the guide part 13 is configured in two so as to be coupled corresponding to each of the two protruding regions 12b.

The main power line 14 is configured in a track shape and is disposed in a state in which it is inserted into the coil accommodation region 13a of the guide part 13. In this case, the main power line 14 is composed of two lines, and each main power line 14 is inserted into and disposed in each of the two coil accommodation regions 13a. The main power line 14 is disposed to extend from a rear direction shown in FIG. 2 to a front direction while being interpolated in the guide part 13. The main power line 14 receives a power with a rated power of 2.3 kW, a track current of 80 A, and a driving frequency of 60 KHz from a power supply unit 2 while an outer temperature is 22° C. to 22° C. to wirelessly supply the power to the inner housing 20. However, in the inventive concept, the rated power, the track current, and the driving frequency of the main power line 14 are not limited to the above values, and may be modified and set to various values according to a supply type of wireless power.

The first coupling part 15 is formed of a flat head bolt. The first coupling part 15 is screw-coupled to a first fastening hole 11a until a head portion of the first coupling part 15 is in close contact with the counter sink of the second fastening hole 12c while the body portion passes through the second fastening hole 12c. The first coupling part 15 couples the track part 12 to the base 11 in close contact with each other. Here, the first coupling part 15 is shown as a flat head bolt, but the first coupling part 15 may be modified and implemented in various forms capable of fastening the base 11 and the track part 12. In addition, the first coupling part 15 is made of a resin material or a ceramic material. For example, the first coupling part 15 may be made of a polyether ether ketone (PEEK) material. Since the first coupling part 15 is formed of a resin material or a ceramic material, an eddy current is not generated by an induced magnetic field generated from the main power line 14 or the coil 22, thereby preventing a heat generation. In addition, the first coupling part 15 is composed of a plurality as shown in the view, and each of them is coupled between the base 11 and the track part 12, thereby improving a coupling force between the base 11 and the track part 12.

The second coupling part 16 is formed of a flat head bolt. A body portion of the second coupling part 16 is screw-coupled to the third fastening hole 12d until the head portion of the second coupling part 16 is in close contact with the counter sink of the fourth fastening hole 13b while the body portion passes through the fourth fastening hole 13b. The second coupling part 16 couples the guide part 13 in close contact with the protruding region 12b of the track part 12. Here, the second coupling part 16 is shown as a flat head bolt, but the second coupling part 16 may be modified and implemented in various forms capable of fastening the guide part 13 and the track part 12. In addition, the second coupling part 16 is made of a resin material or a ceramic material. For example, the second coupling part 16 may be made of a polyether ether ketone (PEEK) material. Since the second coupling part 16 is formed of a resin material or a ceramic material, an eddy current is not generated by an induced magnetic field generated from the main power line 14 or the coil 22, thereby preventing a heat generation.

The drift preventing body 19 is formed in a plate shape and is coupled between the base 11 and the track part 12. In this case, the drift preventing body 19 concentrates the induced magnetic field generated from the main power line 14 toward a core part 21 to increase a electromotive force induced by the coil 22. In this case, the drift preventing body 19 is formed to have a width greater than that between the main power lines 14 so that the induced magnetic field generated by the main power lines 14 is concentrated at the core part 21 side. In addition, the drift preventing body 19 is formed of a ferrite material to concentrate the induced magnetic field generated at the main power line 14 toward the core part 21.

The inner housing 20 is disposed to be spaced apart from the outer housing 10, is installed in the substrate treating apparatus 1, and is electrically connected to a power source of the substrate treating apparatus 1. If a current flows through the main power line 14 at the outer housing 10, the inner housing 20 generates an electromotive force by the induced magnetic field to wirelessly supply a power to the power source of the substrate treating apparatus 1.

In the embodiment, the inner housing 20 includes a core part 21 and a coil 22.

The core part 21 includes a coil winding region 21a on which the coil 22 is wound, and an outer region 21b formed to protrude in the same direction as the coil winding region 21a while extending from the coil winding region 21a and disposed to surround an outer space of the coil 22. The core part 21 is magnetically induced if an induced current is generated in the main power line 14 to increase an intensity of the induced magnetic field of the coil 22. In the embodiment, the core part 21 may be formed of a ferrite material. However, the configuration of the core part 21 is not limited to a ferrite alloy, and may be modified into a core of various materials. A bracket (not shown) is further formed around the core part 21, and the bracket surrounds the core part 21 to insulate the core part 21, protects it from foreign substances, and provides a region to be coupled to the substrate treating apparatus 1.

The coil 22 is formed by being wound on the coil winding region 21a of the core part 21 a plurality of times. If a magnetic field is generated in the main power line 14, the coil 22 receives an amplified induced magnetic field by the core part 21 to generate an electromotive force. In this case, the coil 22 is electrically connected to the power source of the semiconductor manufacturing facility or the power source of the semiconductor transfer robot to transmit a electromotive force generated by the magnetic induction.

Hereinafter, an operation effect of the wireless power apparatus for the substrate treating apparatus as described above will be described.

Figure 3:
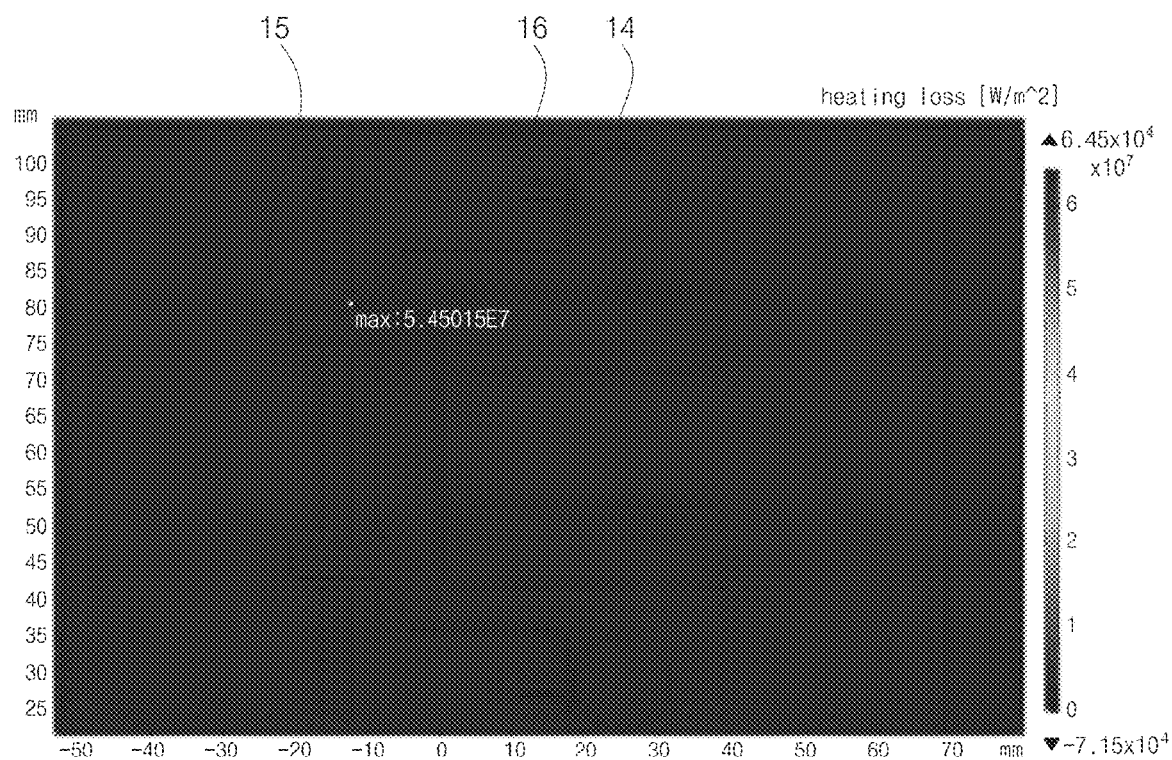
FIG. 3 is a temperature distribution view analyzing a heat generation amount around an outer housing shown in FIG. 2.
Figure 4:
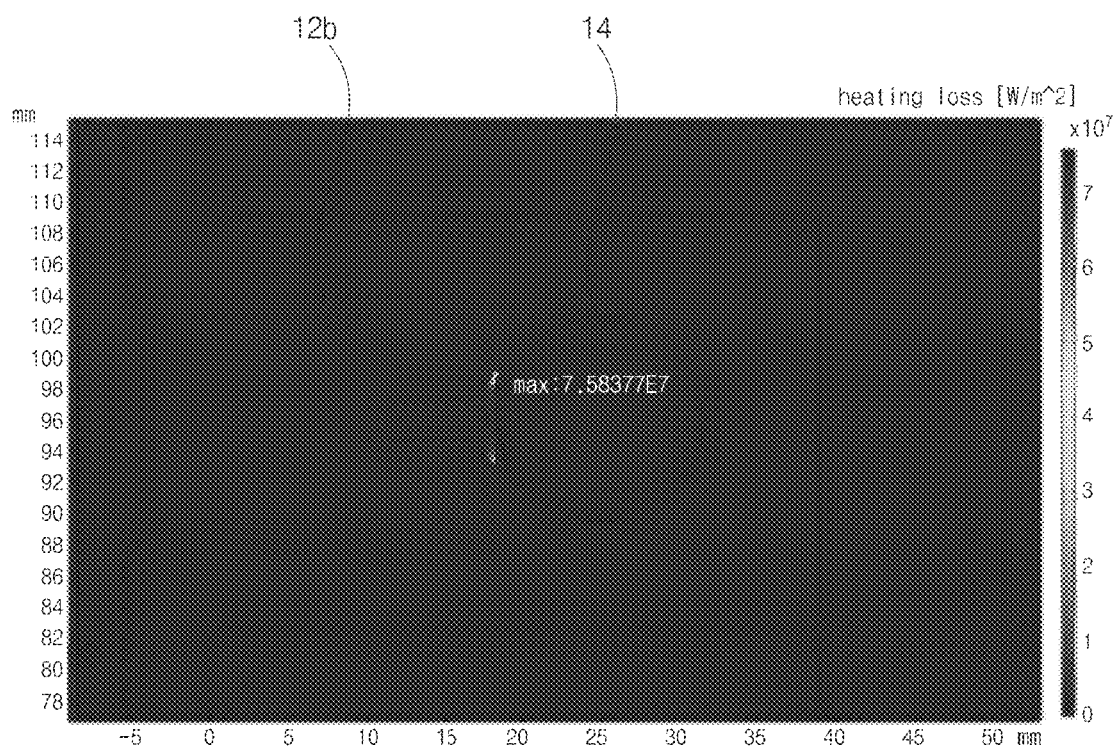
FIG. 4 is a temperature distribution view in which a heat generation amount is analyzed if a first coupling part and a second coupling part of the outer housing shown in FIG. 2 are formed of an aluminum screw.

FIG. 3 is a temperature distribution view analyzing a heat generation amount around the outer housing 10 shown in FIG. 2. FIG. 4 is a temperature distribution view in which the heat generation amount is analyzed if the first coupling part 15 and the second coupling part 16 of the outer housing 10 shown in FIG. 2

First, as described above, the inner housing 20 is disposed to be spaced apart in a state in which the outer housing 10 is installed. In this case, the inner housing 20 is electrically connected to the power source of the substrate treating apparatus 1 while being coupled to the substrate treating apparatus 1.

In addition, the main power line 14 of the outer housing 10 receives a high frequency current from the power supply unit 2. In this case, the main power line 14 receives a power with a rated power of 2.3 kW, a track current of 80 A, and a driving frequency of 60 KHz from the power supply unit (2) while an outer temperature is 22° C. to 22° C.

Then, the main power line 14 generates an electrical magnetic field around it to magnetically induce the coil 22 and the core part 21.

In this case, the coil 22 is magnetically induced by the magnetic field generated by the main power line 14 to generate an electromotive force, at which the core 21 amplifies an induced magnetic field strength around the coil 22 to amplify the electromotive force flowing through the coil 22.

Next, the coil 22 continuously supplies the electromotive force generated by a magnetic induction to the substrate treating apparatus 1.

In this case, since the main power line 14 and the coil 22 continuously generate an induced magnetic field, the surrounding metals may have a problem of generating a heat due to an eddy current.

Accordingly, looking at surrounding ambient temperatures of the first coupling part and the second coupling part 16, as shown in FIG. 3, it may be seen that ambient temperatures of the first coupling part 15 and the second coupling part 16 have a low heating value.

This is because, as described above, materials of the first coupling part 15 and the second coupling part 16 are formed of a resin material or a ceramic material, so that the eddy current is not generated.

In contrast, as illustrated in FIG. 4, in a comparative example in which the second coupling part 16 closest to the main power line 14 is formed of an aluminum material, the second coupling part 16 generates a relatively greater heat around the head portion than in other regions.

In this case, since the second coupling part 16 is adjacent to the main power line 14, the main power line 14 further heats the main power line 14, and as a resistance of an inner resistance increases and a heat generation amount increases, it acts as a factor of a power loss increase by increasing a drift load loss. Of course, a method of reducing an influence of the induced magnetic field by separating the outer housing 10 and the inner housing 20 may be considered so the heat generation amount in the first coupling part 15 and the second coupling part 16 of a metal material may be decreased, but this method increases a design cost due to a complicated design, and especially because an installation space of the inner housing 20 in the substrate treating apparatus 1 is not sufficient, a specification standard of the substrate treating apparatus 1 may not be fulfilled.

However, the substrate treating apparatus 1 according to an embodiment of the inventive concept prevents the eddy current from occurring in a coupling element since the first coupling part 15 and the second coupling part 16 for fastening the outer housing 10 are formed of a resin material or a ceramic material. Therefore, the substrate treating apparatus 1 according to an embodiment of the inventive concept has the advantage of having a simple design and being able to change a design in various ways even within the substrate treating apparatus 1 with a small space, and a heat of the outer housing 10 does not affect a process of the semiconductor manufacturing facility.

Figure 5:
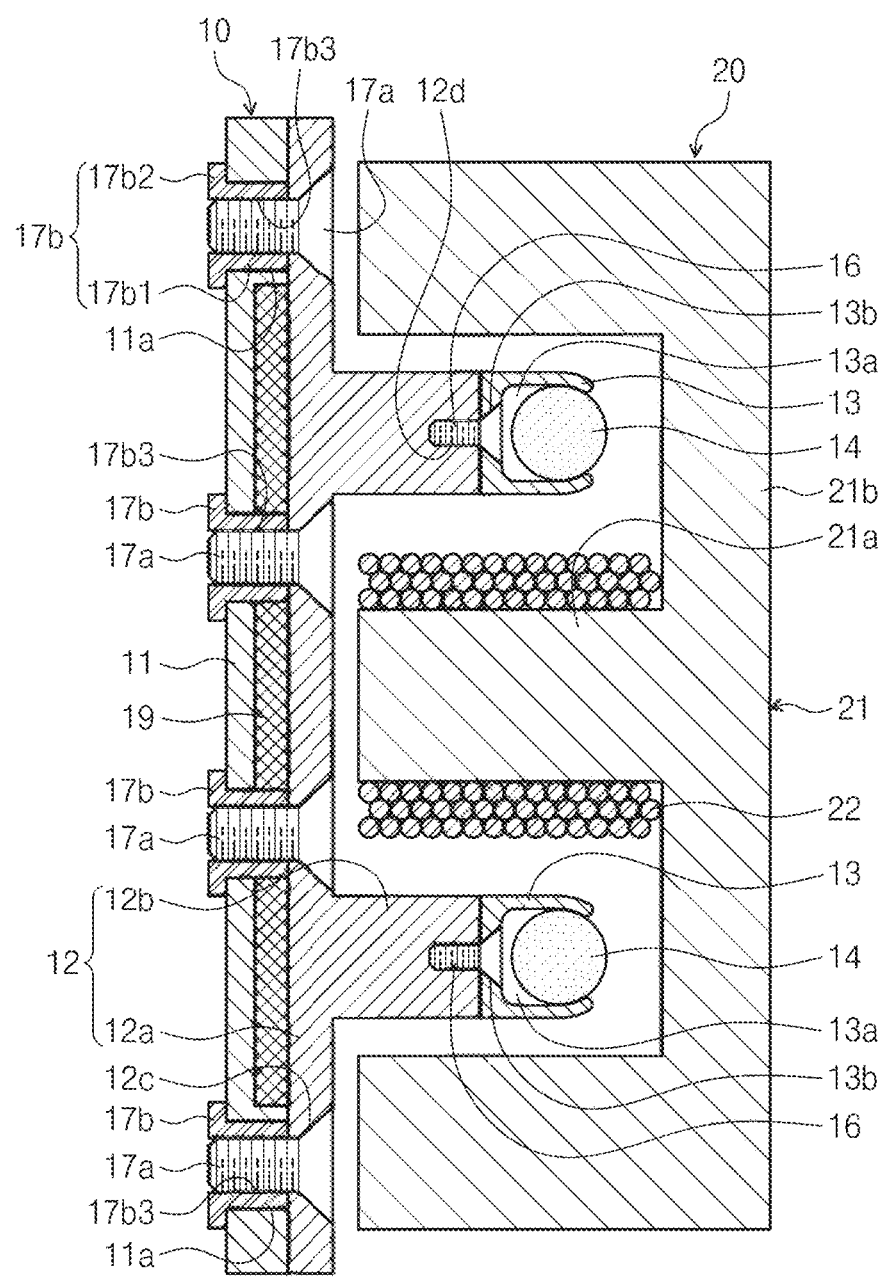
FIG. 5 is a cross-sectional view of the substrate treating apparatus according to another embodiment of the inventive concept.

FIG. 5 is a cross-sectional view of the substrate treating apparatus according to another embodiment of the inventive concept.

Referring further to FIG. 5, the substrate treating apparatus according to another embodiment of the inventive concept includes the outer housing 10 and the inner housing 20.

Here, the outer housing 10 and the inner housing 20 are composed of almost the same components as in the above-described embodiment, and the outer housing is configured to further include a third coupling part 17a and an auxiliary coupling part 17b without forming a first coupling part 15. Accordingly, in a description of this embodiment, redundant descriptions of the same components as in the above-described embodiment will be omitted, and the third coupling part 17a and the auxiliary coupling part 17b will be mainly described.

The third coupling part 17a is formed of a flat head bolt. A body portion of the third coupling part 17a is screw-coupled to the fastening hole 17b3 of the auxiliary coupling part 17b. In this case, the body portion of the third coupling part 17a is screw-coupled to the fastening hole 17b3 until the head portion is in close contact with a counter sink of the second fastening hole 12c. The third coupling part 17a couples the track part 12 to the base 11 in close contact with each other. Here, the third coupling part 17a is illustrated as a flat head bolt, but the third coupling part 17a may be modified and implemented in various forms capable of fastening the base 11 and the track part 12. In addition, the third coupling part 17a is made of a resin material or a ceramic material. For example, the third coupling part 17a may be made of a polyether ether ketone (PEEK) material. Since the third coupling part 17a is made of a resin material or a ceramic material, an eddy current is not generated by the induced magnetic field generated from the main power line 14 or the coil 22, thereby preventing a heat generation.

The auxiliary coupling part 17b is formed in a cylindrical shape and includes a cylindrical part 17b1 and a protruding part 17b2 in which the outer periphery of the end of the cylindrical part 17b1 extends to a diameter larger than the diameter of a cylindrical body. In addition, the cylindrical part 17b1 is further formed with a fastening hole 17b3 interlocking in the central axis direction. In this case, the cylindrical part 17b1 is inserted into the first fastening hole 11a of the base 11 until the protruding part 17b2 adheres closely to a surface of the base 11. Therefore, since the auxiliary coupling part 17b is fixed in a specific position of the base 11, the base 11 and the track part 12 are always coupled at a specific position if being coupled by the third coupling part to prevent a coupling error between the base 11 and the track part 12. Here, in the cylindrical part 17b1, the body portion of the third coupling part 17a is screw-coupled to the fastening hole. In addition, the auxiliary coupling part 17b is made of a resin material or a ceramic material. For example, the auxiliary coupling part 17b may be made of a polyether ether ketone (PEEK) material. Since the auxiliary coupling part 17b is formed of a resin material or a ceramic material, an eddy current is not generated by an induced magnetic field generated from the main power line 14 or the coil 22, thereby preventing a heat generation.

Here, the above-described first coupling part 15 may be directly coupled to the base 11 to be released by a vibration or the like. In contrast, since the third coupling part 17a is not directly coupled to the base 11, and the protruding part 17b2 of the auxiliary coupling part 17b pressurizes the base 11, and the head portion of the third coupling part 17a is coupled while pressurizing the track part 12, a fastening force is increased compared to the first coupling part 15 to prevent a loosening.

In addition, if the first coupling part 15 is directly fastened to the base 11, a processing condition of a screw thread of the first fastening hole 11a of the base 11 or a screw thread of the body portion of the first coupling part 15 is poor, or a coupling angle is abnormally twisted if the first coupling part 15 and the first fastening hole are fastened, or the first coupling part 15 and the first fastening hole 11a can be frequently fastened to the screw hole 115a thereby causing a deterioration of the screw threads so a fastening force may not be maintained. If such cases occur, the entire base 11 must be decomposed and reinstalled, which causes a problem in that not only a replacement cost but also a substrate treatment process must be stopped. However, as in this embodiment, if the third coupling part 17a and the auxiliary coupling part 17b are used, only the third coupling part 17a and the auxiliary coupling part 17b need to be replaced, thereby lowering a replacement cost and making the replacement operation very simple.

Figure 6:
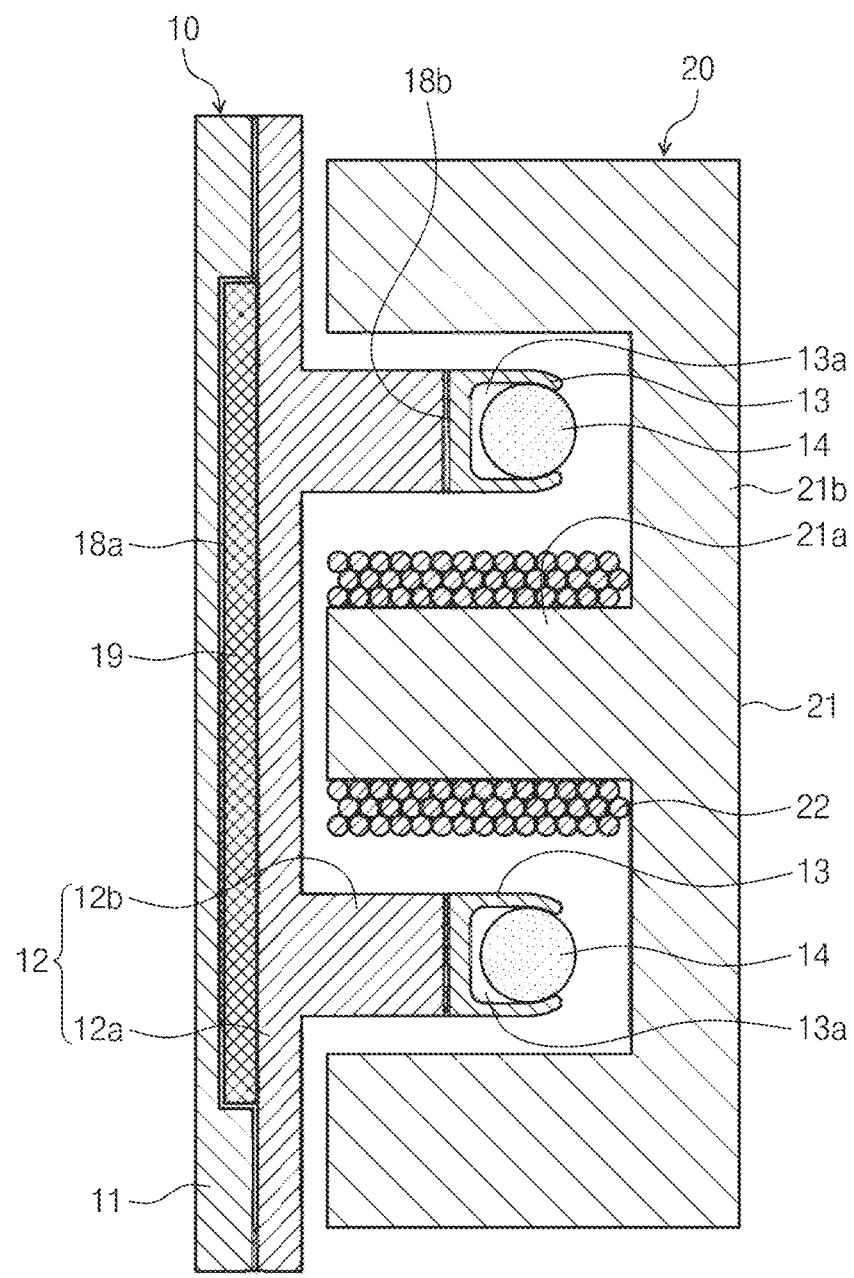
FIG. 6 is a cross-sectional view of the substrate treating apparatus according to another embodiment of the inventive concept.

FIG. 6 is a cross-sectional view of the substrate treating apparatus according to another embodiment of the inventive concept.

Referring further to FIG. 6, the substrate treating apparatus according to another embodiment of the inventive concept includes an outer housing 10 and inner housing 20.

Here, the outer housing 10 and the inner housing 20 are almost the same components as in the above-described embodiment, and the difference is that the outer housing 10 does not constitute the first coupling part 15 and the second coupling part 16 and further includes a fourth coupling part 18a and a fifth coupling part 18b.

Accordingly, in the description of this embodiment, repeated descriptions of the same components as in the above-described embodiment will be omitted, and the fourth coupling part 18a and the fifth coupling part 18b will be mainly described.

The fourth coupling part 18a is made of a resin material and is filled between the base 11 and the track part 12 to bond between the base 11 and the track part 12. In this case, if a drift preventing body 19 is included, the fourth coupling part 18a is bonded to the drift preventing body 19 and the track part 12 while the drift preventing body 19 is in close contact with the track part 12. The fourth coupling part 18a is formed of a resin material. Therefore, since the fourth coupling part 18a is formed of a resin material, a heat generation is prevented by preventing an eddy current from being generated by the induced magnetic field generated by the main power line 14 or the coil 22.

The fifth coupling part 18b is made of a resin material and is filled between the track part 12 and the guide part 13 to bond the track part 12 and the guide part 13. The fifth coupling part 18b is formed of a resin material. Therefore, since the fifth coupling part 18b is formed of the resin material, a heat generation is prevented by preventing an eddy current from being generated by the induced magnetic field generated by the main power line 14 or the coil 22.

As described above, the substrate treating apparatuses according to an embodiment of the inventive concept use a coupling element for fastening detailed configurations of the outer housing 10. Examples of these coupling elements may include a first coupling part 15 and a second coupling part 16 using a screw coupling method, a third coupling part 17a and an auxiliary coupling part 18b using a method similar to a bolt and a nut, and a fourth coupling part 18a and a fifth coupling part 18b using a bonding coupling method. In this case, since the coupling elements are all made of a resin material or a ceramic material, the eddy current is prevented from being generated by the induced magnetic field generated from the main power line 14 or the coil 22, thereby preventing the heat generation.

In this case, in the inventive concept, the coupling elements for fastening the detailed components of the outer housing 10 are fastened using the aforementioned method as well as optional coupling elements such as a bolt, a nut, a washer, a key, a cotter, a pin, and a spline, and these coupling elements may be made of a resin or a ceramic. Accordingly, the fastening elements are prevented from generating a heat by preventing the eddy current from being generated by the induced magnetic field generated by the main power line 14 or the coil 22.

Hereinafter, a method of manufacturing a wireless power apparatus for a substrate treating apparatus according to an embodiment of the inventive concept as described above will be described.

Figure 7:
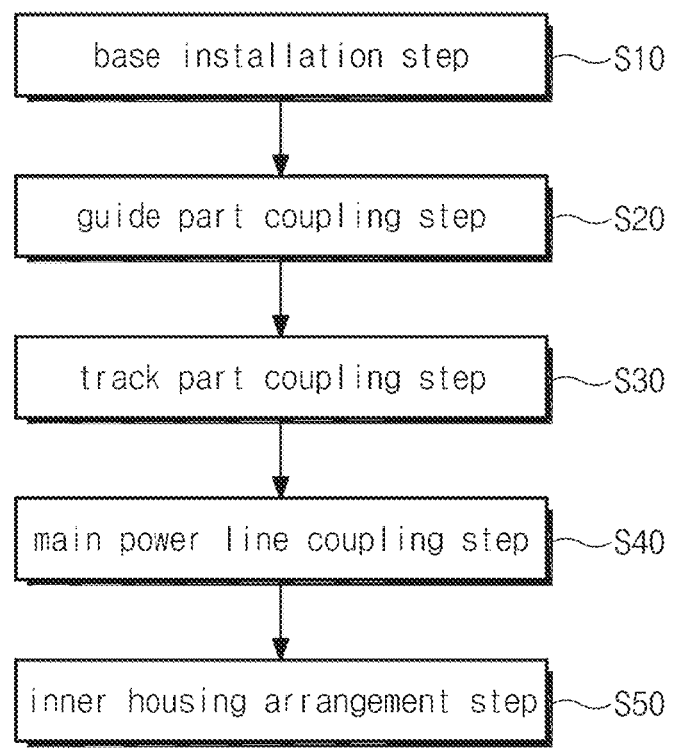
FIG. 7 is a flowchart of a manufacturing method of the wireless power apparatus for the substrate treating apparatus according to another embodiment of the inventive concept.

FIG. 7 is a flowchart illustrating a manufacturing method of the wireless power apparatus for the substrate treating apparatus according to another embodiment of the inventive concept.

Referring to FIG. 7, the manufacturing method of the wireless power apparatus for the substrate treating apparatus in accordance with another embodiment of the inventive concept includes a base installation step S10, a guide part coupling step S20, a track part coupling step S30, a main power line coupling step S40, and an inner housing arrangement step S50.

In the base installation step S10, the base 11 is disposed in a fixed state. In this case, the base 11 may be coupled and fixed to a support member (not shown) which is not shown in the drawing, and in this case, the support member may be coupled to a ceiling or a floor surface to support the base 11.

In the guide part coupling step S20, a wide surface of the coupling region 12a of the track part 12 is arranged to be horizontal with the wide surface of the base 11, and as shown in FIG. 1, the guide part 13 is coupled to the second coupling part 16 or to the fifth coupling part 18b 13 as shown in FIG. 5. Therefore, the manufacturing method of the wireless power apparatus for the substrate treating apparatus according to another embodiment of the inventive concept uses a resin or a ceramic second coupling part 16 and fifth coupling part 18b in the guide part coupling step S20, so that a heat generation with respect to an eddy current is not generated in the coupling element as described above.

In the track part coupling step S30, as shown in FIG. 2, the base 11 and the track part 12 are directly screw-coupled to the first coupling part 15, or the third coupling part 17a and the auxiliary coupling part 17b are screw-coupled to connect the base 11 and the track part 12 by a pressure of the third coupling part 17a or the base 12a. Therefore, the manufacturing method of the wireless power apparatus for the substrate treating apparatus according to another embodiment of the inventive concept uses a resin or ceramic third coupling part 17a and fourth coupling part 18a in the track part coupling step S30, so that a heat generation with respect to the eddy current is not generated in the coupling element as described above.

Here, the guide part coupling step S20 and the track part coupling step S30 may be performed by changing an operation order as necessary.

In the main power line coupling step S40, the main power line 14 is inserted to be fitted into an accommodation region of the guide part 13.

In the inner housing placement step S50, the inner housing 20 is positioned so that the coil 22 and the coil winding region 21a of the core part 21 are placed between the main power line 14. In this way, the coil 22 within the inner housing 20 is magnetically induced by a high frequency current flowing through the main power line 14 to supply a power to the substrate treating apparatus 1.

The effects of the inventive concept are not limited to the above-mentioned effects, and the unmentioned effects can be clearly understood by those skilled in the art to which the inventive concept pertains from the specification and the accompanying drawings.

Although the preferred embodiment of the inventive concept has been illustrated and described until now, the inventive concept is not limited to the above-described specific embodiment, and it is noted that an ordinary person in the art, to which the inventive concept pertains, may be variously carry out the inventive concept without departing from the essence of the inventive concept claimed in the claims and the modifications should not be construed separately from the technical spirit or prospect of the inventive concept.

What is claimed is:

1. A wireless power apparatus for a substrate treating apparatus comprising:
   an outer housing having a main power line configured to generate an induced magnetic field by receiving a power, and a coupling part configured to couple at least two components among components which are positioned at a periphery of the main power line configured to fix the main power line; and
   an inner housing positioned spaced apart from the outer housing and configured to generate an electromotive force through the induced magnetic field generated from the outer housing, and configured to supply the electromotive force to the substrate treating apparatus, and
   wherein the coupling part includes a material at which an eddy current is not generated by the induced magnetic field,
   wherein the outer housing further includes a drift prevention body configured to concentrate the induced magnetic field toward the inner housing, and the drift prevention body includes a ferrite material.

2. The wireless power apparatus for the substrate treating apparatus of claim 1, wherein the outer housing further comprises a base at a periphery of the substrate treating apparatus as a component of the at least two components, and a track part closely contacting the base and providing a region at which the main power line in mounted.

3. The wireless power apparatus for the substrate treating apparatus of claim 2, wherein the outer housing further comprises a guide part which closely contacts the track part and which surrounds the main power line and which is coupled to the main power line, and
   the coupling part is configured in a plurality, and the plurality of coupling parts each couple the base and the track part, and couple the track part and the guide part.

4. The wireless power apparatus for the substrate treating apparatus of claim 3, wherein the drift prevention body is positioned between the base and the track part.

5. The wireless power apparatus for the substrate treating apparatus of claim 3, wherein the coupling part communicates and is screw-coupled to the track part and the base.

6. The wireless power apparatus for the substrate treating apparatus of claim 3, wherein the outer housing further comprises an auxiliary coupling part configured to couple to the coupling part and pressurizes the base and the track part.

7. The wireless power apparatus for the substrate treating apparatus of claim 6, wherein the coupling part is configured to fasten to the auxiliary coupling part in a state in which the base and the track part are not screw-coupled.

8. The wireless power apparatus for the substrate treating apparatus of claim 7, wherein the auxiliary coupling part has a body portion defining a coupling hole and including a protrusion extending in an outer circumference direction of the body portion, and
   the body portion of the auxiliary coupling part is configured to be inserted to communicate with the base, and
   the base and the track part are between the coupling part and the protrusion of the auxiliary coupling part, and
   the coupling part and the auxiliary coupling part are fastened in a state pressurizing the base and the track part.

9. The wireless power apparatus for the substrate treating apparatus of claim 3, wherein the coupling part is configured to couple the base and the track part with a bonding.

10. The wireless power apparatus for the substrate treating apparatus of claim 9, wherein the coupling part includes a resin material and configured to couples the base and the track part with a bonding between the base and the track part.

11. The wireless power apparatus for the substrate treating apparatus of claim 3, wherein the coupling part is configured to couple the track part and the guide part with a bonding.

12. The wireless power apparatus for the substrate treating apparatus of claim 11, wherein the coupling part is composed of a resin material and couples the base and the guide part with a bonding between the base and the guide part.

13. The wireless power apparatus for the substrate treating apparatus of claim 1, wherein the coupling part includes a resin material or a ceramic material.

14. The wireless power apparatus for the substrate treating apparatus of claim 1, wherein the inner housing includes a coil and a core part at which the coil is wound around.

15. The wireless power apparatus for the substrate treating apparatus of claim 14, wherein
the core part includes
the coil is wound around a coil winding region,
an outer region protruding in a same direction as the coil winding region, and
the outer region extending from the coil winding region and surrounding an outer space of the coil.

16. The wireless power apparatus for the substrate treating apparatus of claim 14, wherein the core part includes a ferrite material.

17. The wireless power apparatus for the substrate treating apparatus of claim 1, wherein the substrate treating apparatus is included in a semiconductor manufacturing facility or includes a semiconductor transfer robot.

18. A wireless power apparatus for a substrate treating apparatus comprising:
an outer housing having a main power line configured to generate an induced magnetic field by receiving a power, a base at a periphery of the substrate treating apparatus, a track part closely contacting the base, a guide part which closely contacts the track part surrounds the main power line and is coupled to the main power line, a drift prevention body at a periphery of the main power line between the base and the track part and includes a ferrite material, a coupling part configured to couple at least two components among the base, the track part, the guide part, and the drift prevention body, the coupling part includes a resin material or a ceramic material, and an auxiliary coupling part configured to couple with the coupling part and pressurizes the base and the track part; and
an inner housing having a coil configured to generate an electromotive force through an induced magnetic field generated from the outer housing and configured to supply the electromotive force to the substrate treating apparatus, the coil is wound around a coil winding region, the coil winding region includes a ferrite material, and an outer region protruding in a same direction as the coil winding region extending from the coil winding region and surrounding an outer space of the coil; and
wherein the coupling part is configured in a plurality, and the plurality of coupling parts each are configured to couple the base and the track part, and the track part and the guide part,
the drift prevention body includes a ferrite material,
the coupling part is configured to be screw-coupled to the track part and the base,
the coupling part is configured to fasten to the auxiliary coupling part in a state in which the base and the track part are not screw-coupled,
the auxiliary coupling part has a body portion defining a coupling hole and a protrusion extending in an outer circumference direction of the body portion,
the body portion of the auxiliary coupling part is configured to be inserted to communicate with the base,
the base and the track part are between the coupling part and the protrusion of the auxiliary coupling part,
the coupling part and the auxiliary coupling part are configured to be fastened in a state pressurizing the base and the track part,
the coupling part is configured to couple the base and the track part with a bonding,
the coupling part is configured to couple the base and the track part with a bonding between the base and the track part,
the coupling part is configured to couple the track part and the guide part with a bonding,
the coupling part includes polyether ether ketone (PEEK) material, if formed of a resin material,
the substrate treating apparatus is included in a semiconductor manufacturing facility or includes a semiconductor transfer robot.

\* \* \* \* \*